(12) United States Patent
Park et al.

(10) Patent No.: US 7,262,108 B2
(45) Date of Patent: Aug. 28, 2007

(54) METHODS FOR FORMING RESISTORS FOR INTEGRATED CIRCUIT DEVICES

(75) Inventors: Je-Min Park, Gyeonggi-do (KR);
Yoo-Sang Hwang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 242 days.

(21) Appl. No.: 10/961,896

(22) Filed: Oct. 8, 2004

(65) Prior Publication Data
US 2005/0095779 A1 May 5, 2005

(30) Foreign Application Priority Data
Oct. 29, 2003 (KR) ...................... 10-2003-0075750

(51) Int. Cl.
*H01L 21/20* (2006.01)
(52) U.S. Cl. ............... 438/384; 438/171; 257/E21.017; 257/E21.02
(58) Field of Classification Search ............... 438/171, 438/382, 384; 257/E21.017, E21.02
See application file for complete search history.

(56) References Cited

U.S. PATENT DOCUMENTS

| | | |
|---|---|---|
| 6,400,252 B1 | 6/2002 | Smith et al. |
| 6,531,758 B2 | 3/2003 | Shin et al. |
| 2001/0019301 A1* | 9/2001 | Shibuya et al. ............. 338/308 |
| 2002/0166218 A1* | 11/2002 | Barber ...................... 29/25.35 |

* cited by examiner

*Primary Examiner*—Michelle Estrada
*Assistant Examiner*—Jarrett J. Stark
(74) *Attorney, Agent, or Firm*—Myers Bigel Sibley & Sajovec

(57) ABSTRACT

Methods of forming an integrated circuit device may include forming an insulating layer on an integrated circuit substrate, forming a first conductive layer on the insulating layer, and forming a second conductive layer on the first conductive layer so that the first conductive layer is between the second conductive layer and the insulating layer. Moreover, the first conductive layer may be a layer of a first material, the second conductive layer may be a layer of a second material, and the first and second materials may be different. A hole may be formed in the second conductive layer so that portions of the first conductive layer are exposed through the hole. After forming the hole in the second conductive layer, the first and second conductive layers may be patterned so that portions of the first and second conductive layers surrounding portions of the first conductive layer exposed through the hole are removed while maintaining portions of the first conductive layer previously exposed through the hole.

13 Claims, 11 Drawing Sheets

METHODS FOR FORMING RESISTORS FOR INTEGRATED CIRCUIT DEVICES

RELATED APPLICATIONS

The present application claims the benefit of and priority under 35 U.S.C. Sec. 119 to Korean Application No. 2003-0075750 filed Oct. 29, 2003, the disclosure of which is hereby incorporated herein in its entirety by reference.

FIELD OF THE INVENTION

This invention relates generally to the field of semiconductor devices and more particularly methods for forming integrated circuit devices.

BACKGROUND

An integrated circuit semiconductor device (such as a Dynamic Random Access Memory or DRAM device) may include a cell array region having a plurality of cell units; and a peripheral circuit region positioned outside the cell array region and having semiconductor circuits (e.g., a driver, a buffer, an input/output unit, an amplifier, etc.) for controlling read/write operations of cell units and input/output of data. A semiconductor device including a cell array region and a peripheral circuit region may include transistors as active devices, and resistors as passive devices. Hence, a fabrication process for a semiconductor device may include a forming pluralities of transistors and resistors. These semiconductor devices may be formed in the cell array region, and in the peripheral circuit region.

A conventional semiconductor device may include a gate polysilicon resistor using a dummy gate structure in the peripheral circuit region formed from a same material used for a gate structure of the cell array region, a self-aligned contact polysilicon plug resistor using a self-aligned contact plug formed from a same material used for a self-aligned contact plug of the cell array region, and/or a plate electrode polysilicon resistor formed from same material used for a plate electrode of the cell array region. The gate structure and the dummy gate structure may include a spacer formed on the lateral side of the gate stack, and a gate stack having a gate insulation layer, a gate electrode, and a capping layer.

Generally, when a capacitor has a polysilicon-insulator-polysilicon (PIP) structure in a semiconductor device having a COB (Capacitor Over Bit line) structure disposed over a bit line, upper and lower electrodes may be formed from polysilicon as a conductive material. Accordingly, a resistor can be formed using a polysilicon material in the peripheral circuit region. When the capacitor is of a metal-insulator-metal (MIM) structure to enhance the capacitor performance, however, it may be difficult to form a resistor using a polysilicon material. It may be similarly difficult to form a resistor using a polysilicon material when the self-aligned contact plug connecting upper and lower electrodes is formed from a metal material, or when a gate electrode or a bit line electrode is formed from a metal material. Additional steps of polysilicon deposition, photolithography, etching, etc. may be needed to form a polysilicon resistor. A complexity of the fabrication process of the semiconductor device may be increased and defects of the semiconductor device result with an increase of the production cost of the semiconductor device.

SUMMARY OF THE INVENTION

According to embodiments of the present invention, methods of forming an integrated circuit device may include forming an insulating layer on an integrated circuit substrate, and forming a first conductive layer on the insulating layer wherein the first conductive layer includes a first material. A second conductive layer may be formed on the first conductive layer so that the first conductive layer is between the second conductive layer and the insulating layer, and the second conductive layer may include a second material different than the first material. In addition, a hole may be formed in the second conductive layer so that portions of the first conductive layer are exposed through the hole. After forming the hole in the second conductive layer, the first and second conductive layers may be patterned so that portions of the first and second conductive layers surrounding portions of the first conductive layer exposed through the hole are removed while maintaining portions of the first conductive layer previously exposed through the hole.

Patterning the first and second conductive layers may include maintaining portions of the first and second conductive layers to define a conductive line spaced apart from the portion of the first conductive layer previously exposed through the hole. In addition, the conductive line may include portions of the first and second conductive layers. More particularly, patterning the first and second conductive layers may include forming a single photoresist pattern on portions of the first conductive layer previously exposed through the hole and on portions of the first and second conductive layers defining the conductive line, and removing portions of the first and second conductive layers exposed by the single photoresist pattern. Before forming the single photoresist pattern, a capping layer may also be formed on the second conductive layer and on portions of the first conductive layer exposed through the hole, and patterning the first and second conductive layers may include patterning the capping layer. Moreover, the capping layer may be a layer of an insulating material, and the capping layer and the insulating layer may include different materials.

After patterning the first and second conductive layers, portions of the first conductive layer previously exposed through the hole in the second conductive layer may be maintained as a resistor. In addition, a capping layer may be formed on the second conductive layer and on the portions of the first conductive layer exposed through the hole after forming the hole and before patterning the first and second conductive layers. Moreover, patterning the first and second conductive layers may include patterning the first and second conductive layers and the capping layer so that the capping layer is maintained on portions of the first conductive layer previously exposed through the hole.

The first conductive layer may include at least one of titanium nitride (TiN), tantalum nitride (TaN), titanium silicon nitride (TiSiN), and/or tantalum silicon nitride (TaSiN). More particularly, the first conductive layer may includes at least two sub-layers, with a first sub-layer including at least one of titanium (Ti) and/or tantalum (Ta), and with a second sub-layer including at least one of titanium nitride (TiN), tantalum nitride (TaN), and/or tantalum silicon nitride (TaSiN). The second conductive layer may include tungsten (W).

Before forming the insulating layer, a plurality of cell array transistors may be formed on a cell array region of the integrated circuit substrate wherein each of the cell array transistors includes a gate electrode and source/drain regions on opposite sides of the gate electrode. In addition, forming the hole in the second conductive layer may include forming the hole on a peripheral circuit region of the integrated circuit substrate outside the cell array region.

Patterning the first and second conductive layers may include maintaining portions of the first and second conductive layers to define a conductive line on the cell array region of the integrated circuit substrate with the conductive line being electrically coupled with a source/drain region of a cell array transistor through a hole in the insulating layer. In addition, a gate electrode of the cell array transistor may be coupled to a word line, and the word line may be perpendicular to the conductive line on the cell array region electrically coupled with the source/drain region of the cell array transistor.

According to additional embodiments of the present invention, methods of forming an integrated circuit device may include forming a transistor on a cell array region of an integrated circuit substrate with the transistor including a gate electrode and first and second source/drain regions on opposite sides of the gate electrode. A conductive bit line pad may be formed on the first source/drain region, and an insulating layer may be formed on the transistor and on the integrated circuit substrate with the insulating layer having a hole therein exposing a portion of the conductive bit line pad.

A conductive barrier layer may be formed on the insulating layer and on the portion of the conductive bit line pad exposed through the hole in the insulating layer so that the conductive barrier layer is electrically coupled with the first source/drain region through the hole and the conductive bit line pad. A conductive bit line layer may be formed on the conductive barrier layer with the conductive barrier layer and the conductive bit line layer comprising different materials. In addition, a hole may be formed in the conductive bit line layer so that portions of the conductive barrier layer are exposed through the hole in the conductive bit line layer in a peripheral circuit region of the integrated circuit substrate outside the cell array region. After forming the hole in the conductive bit line layer, the conductive barrier and bit line layers may be patterned so that portions of the conductive barrier and bit line layers surrounding portions of the conductive barrier layer exposed through the hole in the conductive bit line layer are removed while maintaining portions of the conductive barrier layer previously exposed through the hole in the conductive bit line layer. Moreover, a bit line including portions of the conductive barrier and bit line layers may be maintained in the cell array region electrically coupled with the conductive bit line pad.

More particularly, the conductive barrier layer may include at least one of titanium nitride (TiN), tantalum nitride (TaN), titanium silicon nitride (TiSiN), and/or tantalum silicon nitride (TaSiN). The conductive bit line layer may include tungsten (W).

According to still additional embodiments of the present invention, methods of forming a resistor for an integrated circuit device may include forming an insulating layer on an integrated circuit substrate, and forming a first conductive layer on the insulating layer. A second conductive layer may be formed on the first conductive layer so that the first conductive layer is between the second conductive layer and the insulating layer, and the first and second conductive layers include different materials. The first and second conductive layers may be patterned so that a portion of the first conductive layer is free of the second conductive layer and so that portions of the insulating layer surrounding the portion of the first conductive layer free of the second conductive layer are free of the first and second conductive layers.

Patterning the first and second conductive layers may include removing portions of the second conductive layer from the portion of the first conductive layer free of the second conductive layer. More particularly, patterning the first and second conductive layers may include removing the first and second conductive layers from the portions of the insulating layer surrounding the portion of the first conductive layer free of the second conductive layer. Moreover, removing portions of the second conductive layer from the portion of the first conductive layer free of the second conductive layer may precede removing the first and second conductive layers from the portions of the insulating layer surrounding the portion of the first conductive layer free of the second conductive layer.

In addition, the first conductive layer may include at least one of titanium nitride (TiN), tantalum nitride (TaN), titanium silicon nitride (TiSiN), and/or tantalum silicon nitride (TaSiN). The second conductive layer may include tungsten (W).

According to yet additional embodiments of the present invention, methods of forming an integrated circuit device may include forming a plurality of first capacitor electrodes on a cell array region of a substrate, and forming a capacitor dielectric layer on the plurality of first capacitor electrodes, on portions of the substrate free of the plurality of first capacitor electrodes on the cell array region, and on a peripheral circuit region of the substrate. In addition, a second capacitor electrode layer may be formed on the capacitor dielectric layer on the cell array and peripheral circuit regions of the substrate so that the capacitor dielectric layer is between the second capacitor electrode layer and the plurality of first capacitor electrodes. The second capacitor electrode layer may then be patterned to define a second capacitor electrode on the capacitor dielectric layer on the cell array region and to define a resistor on the peripheral circuit region. Moreover, portions of the substrate may be free of the second capacitor electrode layer between the second capacitor electrode and the resistor.

The second capacitor electrode layer may include at least one of titanium nitride (TiN) and/or tantalum nitride (TaN). More particularly, the second capacitor electrode layer may include at least two sub-layers, with a first sub-layer including at least one of titanium (Ti) and/or tantalum (Ta), and a second sub-layer including at least one of titanium nitride (TiN) and/or tantalum nitride (TaN).

The substrate may also include an insulating layer having conductive plugs therethrough, with each of the conductive plugs being electrically coupled with a respective one of the first capacitor electrodes. Moreover, the substrate may include a plurality of cell array transistors, with each of the cell array transistors being electrically coupled with a respective one of the conductive plugs. In addition, the substrate may include an insulating layer on the cell array region, with the insulating layer including a plurality of holes therein with each of the first capacitor electrodes being formed on sidewalls and bottom surfaces of a respective one of the holes.

According to more embodiments of the present invention, methods of forming an integrated circuit device may include forming a plurality of first capacitor electrodes on a substrate, and forming a capacitor dielectric layer on the plurality of first capacitor electrodes and on portions of the substrate free of the plurality of first capacitor electrodes. A second capacitor electrode layer may be formed on the capacitor dielectric layer so that the capacitor dielectric layer is between the second capacitor electrode layer and the plurality of first capacitor electrodes. In addition, the second capacitor electrode layer may be patterned to define a second capacitor electrode on the capacitor dielectric layer opposite the first capacitor electrodes and to define a resistor with portions of the substrate being free of the second capacitor electrode layer between the second capacitor electrode and the resistor.

According to some embodiments of the present invention, methods may be provided for forming a resistor in a peripheral circuit region of a semiconductor device using a bit line metal layer. According to more embodiments of the present invention, methods may be provided for forming a resistor controllable in size and/or thickness to have a resistance in a predetermined range without being significantly affected by process conditions. According to still more embodiments of the present invention, methods may be provided for forming a resistor using a bit line metal layer in a peripheral circuit region to simplify fabrication and to reduce defects of the semiconductor device.

According to embodiments of the present invention, methods for forming a resistor on a semiconductor substrate including a cell array region and a peripheral circuit region may include: (a) forming transistors having source and drain regions and a gate structure surrounded by a first insulation layer; (b) forming a second insulation layer on an entire face of the semiconductor substrate having the transistors formed thereon, and then forming a barrier layer and a bit line conductive layer on the second insulation layer; (c) patterning the bit line conductive layer to expose the barrier layer in a portion to form the resistor thereon on the peripheral circuit region; (d) forming a capping layer on the entire face of the semiconductor substrate including the exposed barrier layer; and (e) patterning the capping layer and the barrier layer to form the resistor.

According to embodiments of the present invention, methods for forming a resistor on a semiconductor substrate including a cell array region and a peripheral circuit region may include: (a) forming transistors having gate structures surrounded by a first insulation layer on the semiconductor substrate, and then forming a bit line pad between the gate structures; (b) forming a second insulation layer on the entire face of the semiconductor substrate having the transistors formed thereon, and then patterning the second insulation layer to form a bit line contact hole connected to the bit line pad; (c) forming a barrier layer and a bit line conductive layer on the bit line contact hole and the second insulation layer; (d) patterning the bit line conductive layer to expose the barrier layer of a portion to form the resistor thereon on the peripheral circuit region, and then forming a capping layer on the entire face of the semiconductor substrate including the exposed barrier layer; and (e) patterning the capping layer and the barrier layer to form the resistor.

According to embodiments of the present invention, methods for forming a resistor having lower electrodes surrounded by an insulation layer and separated from each other on a semiconductor substrate including a cell array region and a peripheral circuit region may include: (a) forming a dielectric layer on the lower electrodes; (b) forming an upper electrode on the top surface of the dielectric layer; and (c) patterning the upper electrode to form the resistor in the peripheral circuit region.

DETAILED DESCRIPTION OF THE INVENTION

Figure 1:
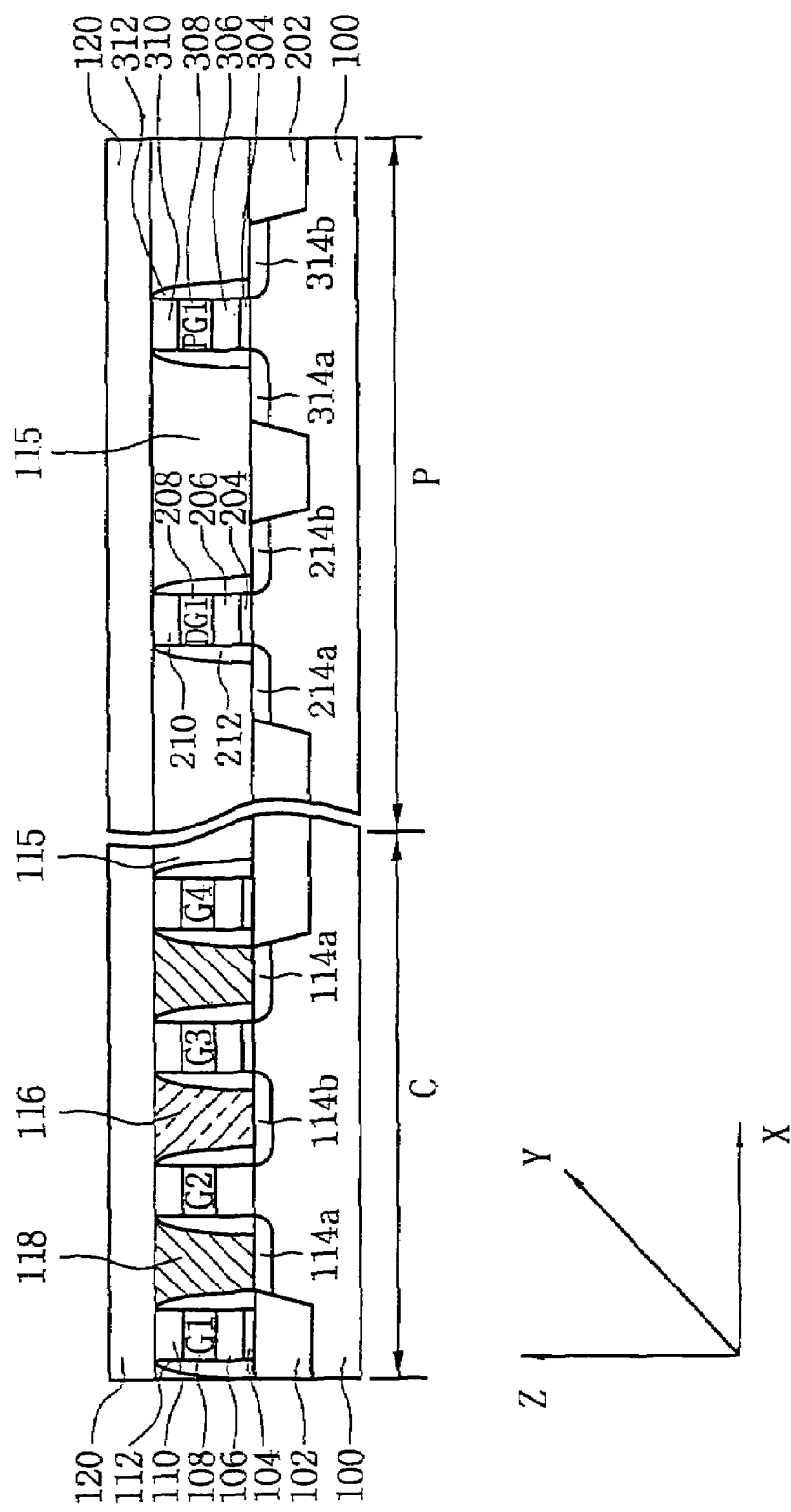
FIGS. 1 to 10 are cross-sectional views illustrating steps of methods for forming resistors used for semiconductor devices according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
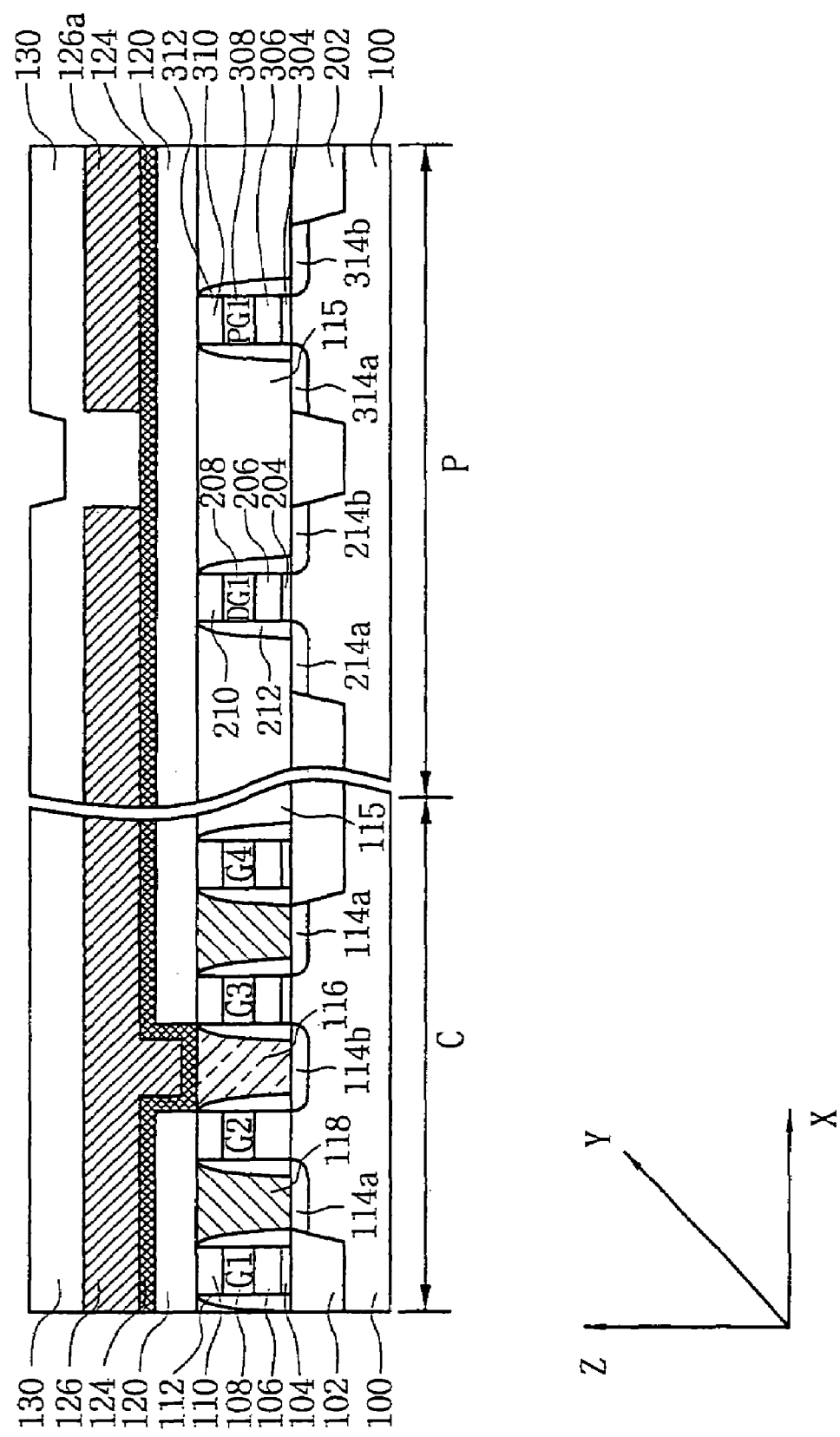
Figure 7:
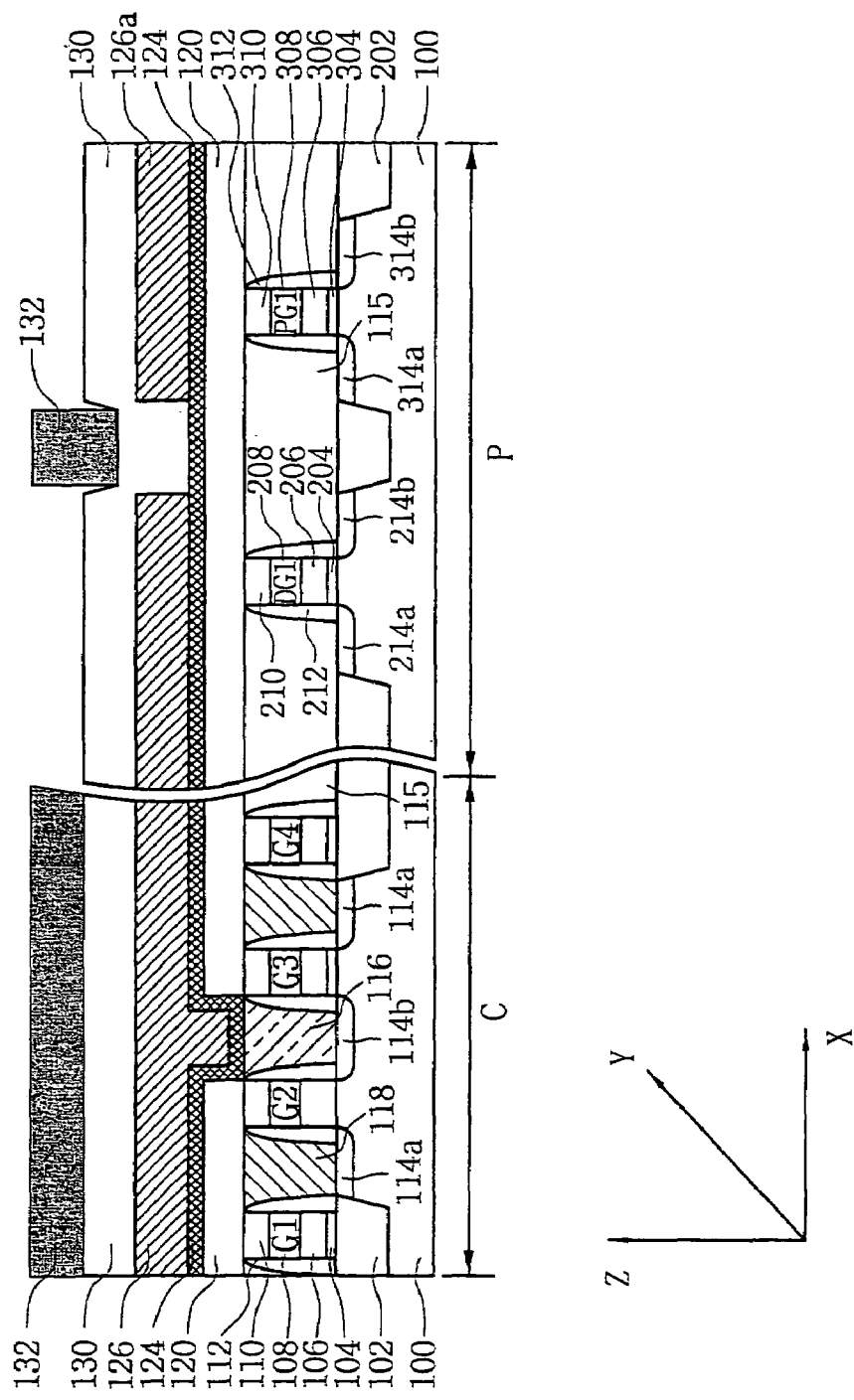
Figure 8:
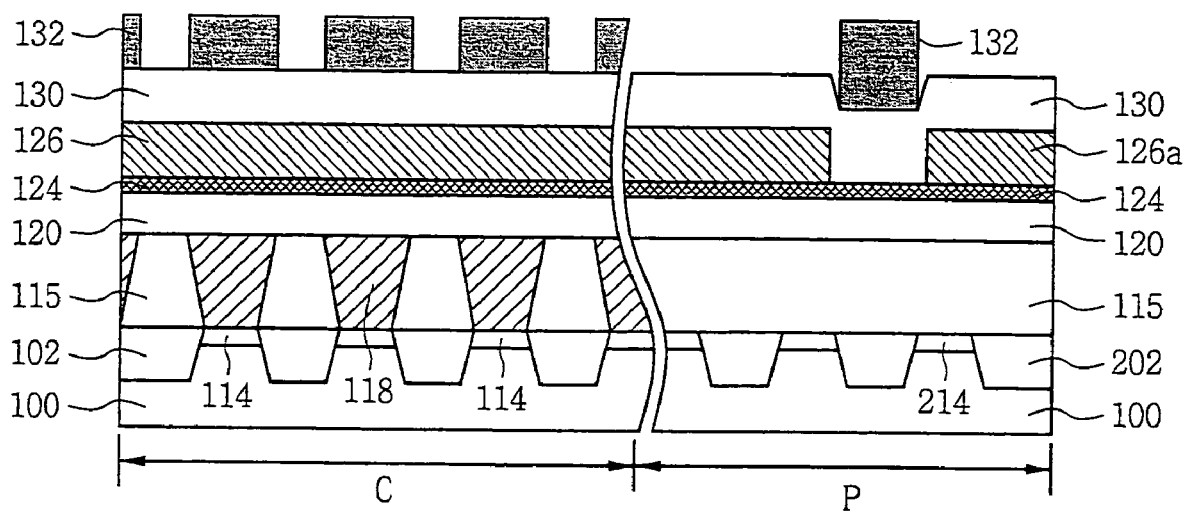
Figure 9:
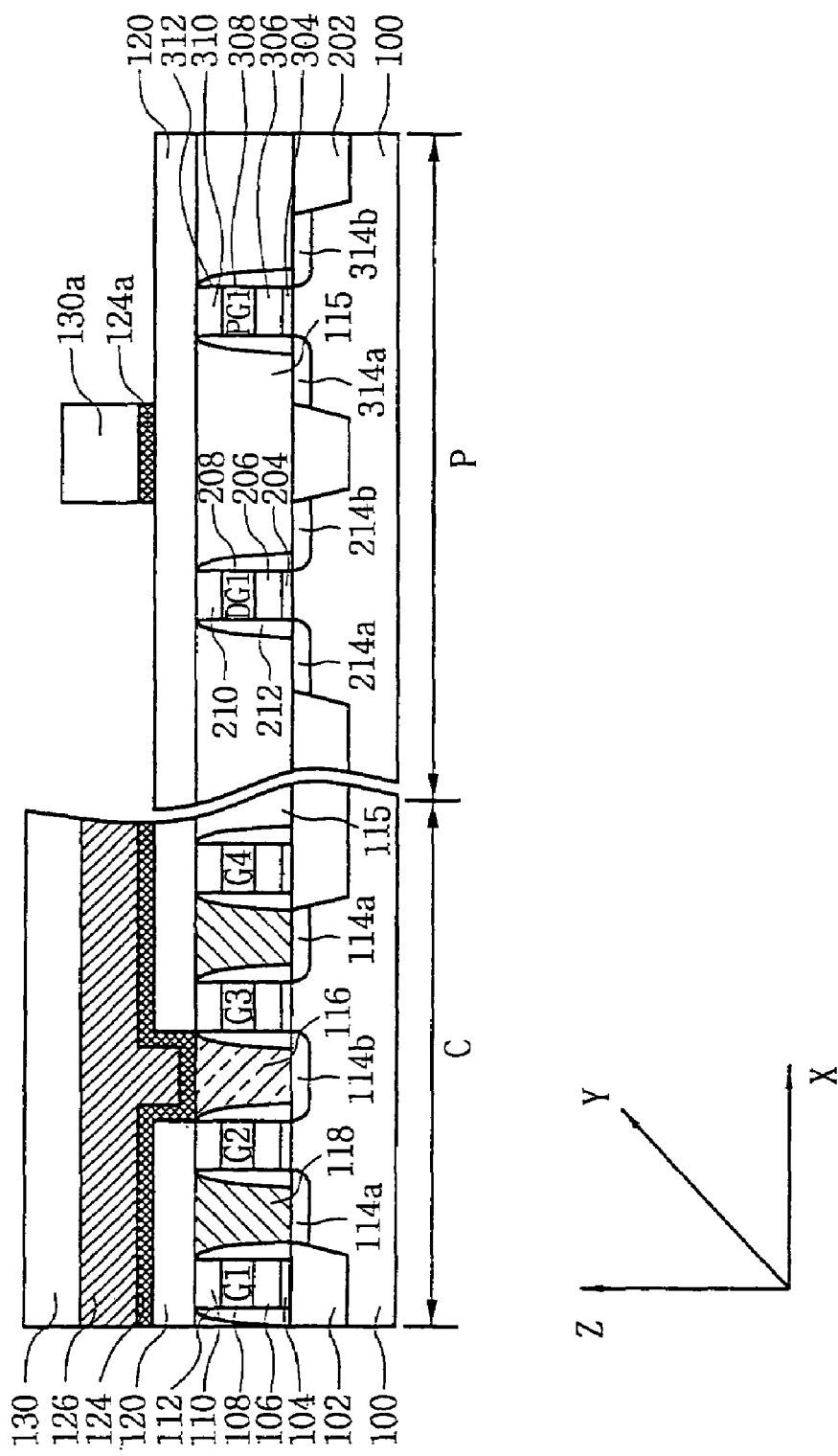
Figure 10:
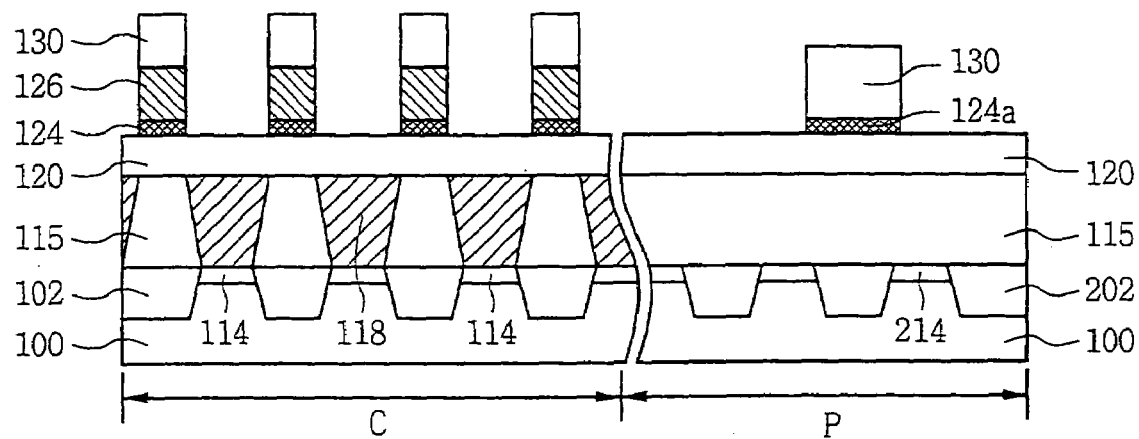

FIGS. 1 to 10 are cross-sectional views illustrating steps of methods for forming a resistor used for a semiconductor device according to first embodiments of the present invention. In each figure, a cell array region C is shown on the left side, and a peripheral circuit region P is shown on the right side. In particular, FIGS. 1 to 7, and 9 are cross-sectional views taken along a line in the direction of a bit line (i.e., the X-axis direction) connected to drains of MOS transistors in the semiconductor device, and FIGS. 8 and 10 are cross-sectional views taken along a line in the direction of a word line (i.e., the Y-axis direction) connected to gates of MOS transistors in the semiconductor device.

Referring to FIG. 1, a device isolation layer 102 may define active and inactive regions of a semiconductor substrate 100 having a cell array region C and a peripheral circuit region P. A well region(s) (not shown) may then be formed by ion-implantation of an impurity onto the semiconductor substrate 100 and a subsequent annealing. The device isolation layer 102 (which may be formed using a device isolation method such as shallow trench isolation (STI)), may include one or more selected from the group of oxide layers consisting of SOG (Spin On Glass), BPSG (Boron Phosphorus Silicate Glass), PSG (Phosphor Silicate Glass), PE-TEOS (Plasma Enhanced Tetra Ethyl Ortho Silicate), USG (Undoped Silicate Glass), and flowable oxide, or a multi-layer including at least two of the oxide layers. A thickness of the device isolation layer 102 may be in the range of approximately 2500 Angstroms to approximately 3000 Angstroms. In an alternative, the device isolation layer 102 may be formed after forming the well region(s).

A layer used to form gate insulation layers 104, 204 and 304 may be formed on an entire face of the semiconductor substrate 100, and layers used to form gate conductive layers 106, 108, 206, 208, 306 and 308 and capping layers 110, 210 and 310 may be laminated in sequence on the layer used to form gate insulation layers 104, 204 and 304. The gate insulation layers 104, 204 and 304 may be formed from a silicon oxide material having a thickness in the range of approximately 40 Angstroms to approximately 60 Angstroms. The gate conductive layers 106, 108, 206, 208, 306 and 308 may be formed as a single layer including a silicide layer (e.g., a tungsten silicide layer) and/or including a polysilicon layer, and having a polycide structure. If the gate electrode has a polycide structure, the gate conductive layers may be formed as a multi-layer. The silicide layer may be a silicide layer including a metal having a high melting point, such as titanium (Ti), tantalum (Ta), tungsten (W), nickel (Ni), chrome (Cr), iridium (Ir), and/or rubidium (Ru). The capping layers 110, 210 and 310 may be formed from a silicon nitride material having an etching selection ratio with respect to an interlayer insulation layer comprising an oxide-based insulation material. In other words, the capping layers and the interlayer insulation layer may comprise different materials that allow selective etching of one with respect to the other.

Photolithography and etching may be carried out on the resulting material to form a gate stack at defined regions of the semiconductor substrate, and then gate spacers 112, 212 and 312 may be formed on the sidewalls of the gate stack.

The gate spacers 112, 212 and 312 may be formed by depositing an insulation layer of a silicon nitride material on an entire face of the semiconductor substrate using chemical vapor deposition (CVD), reflow, and/or high-density plasma (HDP) equipment, and then performing an anisotropic etch.

Subsequently, the gate spacers 112, 212 and 312 may be used as a mask for ion implantation to dope source/drain regions of n-type transistors with an n-type impurity and to dope source/drain regions of p-type transistors with a p-type impurity, to thereby form relatively high-concentration source/drain regions. In addition or in an alternative, before forming the gate spacers, the gate stack may be used as a mask for ion implantation to implant an impurity of a lower concentration at a lower energy than used in forming the high-concentration source/drain regions thereby forming low-concentration source/drain regions. High-concentration portions of source/drain regions having a higher concentration of impurity on a part of the lower-concentration source/drain regions may then be formed using gate spacers 112, 212, and 312 as implant masks. The source/drain regions in this alternative may be referred to as having an LDD (lightly doped drain) structure.

As a result, the cell array region C on the semiconductor substrate 100 may have n-type transistors including gate structures G1, G2, G3 and/or G4 and source/drain regions 114a and 114b. The peripheral circuit region P may include a dummy transistor having a dummy gate structure DG1 and source/drain regions 214a and 214b, and a peripheral transistor having a peripheral gate structure PG1 and the source/drain regions 314a and 314b. The gate structures G1, G2, G3, G4, DG1 and PG1 may include, as previously described, gate insulation layers 104, 204 and 304, gate electrodes 106, 108, 206, 208, 306 and 308, capping layers 110, 210 and 310, and gate spacers 112, 212 and 312. The transistors formed in the peripheral circuit region P may be formed as discussed above or according to different design rules. For example, the peripheral circuit region P may include a plurality of n-type and p-type transistors, or either of a plurality of n-type transistors or p-type transistors.

Subsequently, a first interlayer insulation layer 115 may be formed on an entire face of the semiconductor substrate including the resulting structure with gate spacers 112, 212 and 312 formed thereon and then patterned to form storage node electrode pad contact holes and bit line pad contact holes in the cell array region C. After formation of the first interlayer insulation layer 115, a planarization process (such as chemical mechanical planarization (CMP) and/or etchback) may be performed to planarize a top surface of the first interlayer insulation layer. In addition, a diffusion barrier layer (not shown), such as an insulation layer formed from a silicon nitride material, may be provided before forming the first interlayer insulation layer 115 to reduce penetration of impurities into active regions. The storage node electrode pad contact holes and the bit line pad contact holes may be formed by providing a pattern on a top surface of the first interlayer insulation layer 115 to expose source regions 114a of n-type transistors in the cell array region C and common drain regions 114b of n-type transistors in the cell array region C, and dry-etching the first interlayer insulation layer 115 and the gate insulation layer 104 using the pattern as a dry etching mask. Moreover, a chemistry of the etch may be selected so that the interlayer insulation layer 115 is etched preferentially with respect to the spacers 112, 212, and 312 and capping layers 110, 210 and 310. While not shown in FIG. 1, contact holes may also be formed to expose source/drain regions 214a, 214b, 314a and/or 314b of the dummy and peripheral transistors in the peripheral circuit region P.

The storage node electrode pad contact holes and the bit line pad contact holes may be filled with a conductive material (such as polysilicon) to form storage node electrode pads 118 and bit line pads 116. Then, a second interlayer insulation layer 120 may be formed on an entire face of the semiconductor substrate including storage node electrode pads 118 and bit line pads 116. After forming the storage node electrode pads 118 and bit line pads 116, a planarization process (such as CMP and etch-back) may be performed for the second interlayer insulation layer.

Figure 2:
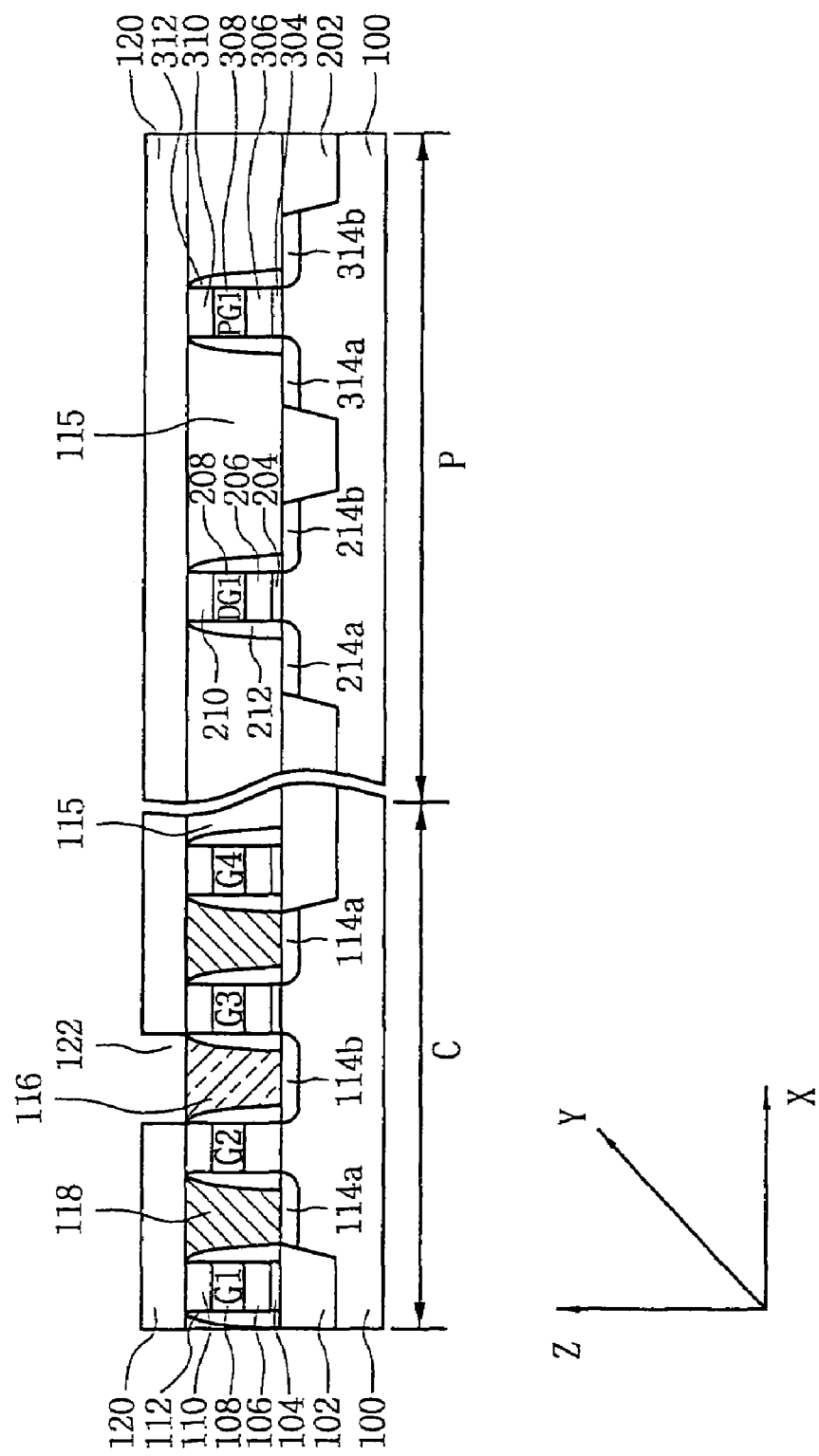

Referring to FIG. 2, photolithography and etching steps may be carried out on the resulting structure including the second interlayer insulation layer 120 formed thereon to leave a bit line contact holes 122 exposing respective bit line pads 116. The bit line contact hole 122 may be provided by forming a photoresist pattern to expose a defined region on a top surface of the second interlayer insulation layer 120 and then etching the second interlayer insulation layer 120 using the photoresist pattern as an etching mask. The photoresist pattern may be removed using an ashing or strip process.

Figure 3:
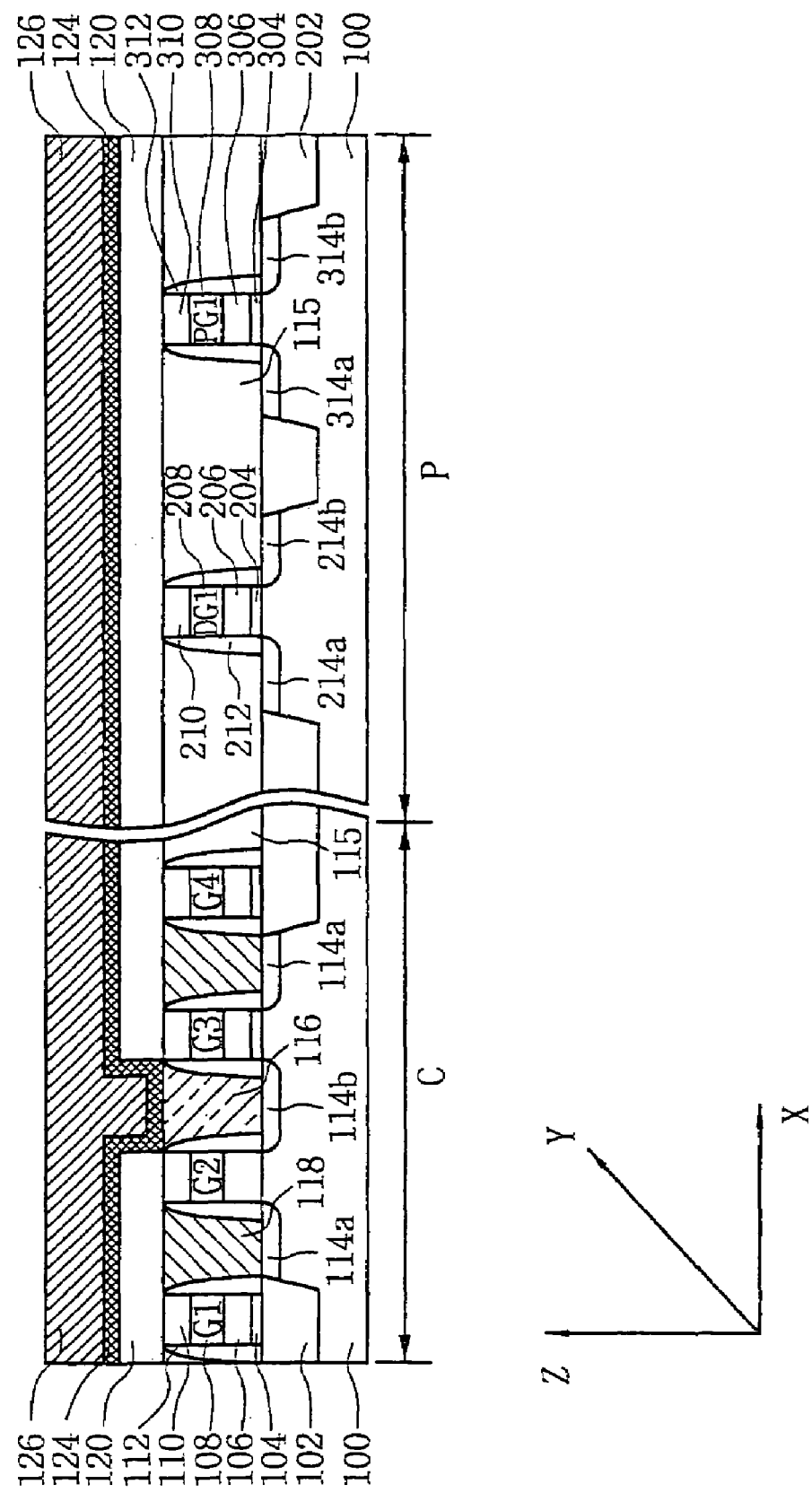

Referring to FIG. 3, a barrier layer 124 may be formed on an entire face of the semiconductor substrate including the bit line contact hole 122, and a bit line conductive layer 126 may then be formed on the top surface of the barrier layer 124. The barrier layer 124 may be formed as a single metal layer having a predetermined resistance as selected from, for example, a titanium nitride (TiN) layer, a tantalum nitride (TaN) layer, a titanium silicon nitride (TiSiN) layer, and/or a tantalum silicon nitride (TaSiN) layer. In an alternative, the barrier layer 124 may be formed as a laminated double layer, including a first metal sub-layer (such as a titanium (Ti) layer and/or a tantalum (Ta) layer) and a second metal sub-layer (such as a titanium nitride (TiN) layer, a tantalum nitride (TaN) layer, a titanium silicon nitride (TiSiN) layer, and/or a tantalum silicon nitride (TaSiN) layer) on the first metal layer. In another alternative the barrier layer 124 may be formed as a double layer sequentially including a titanium (Ti) layer and a titanium nitride (TiN) layer having a resistance in a predetermined range. The titanium (Ti) layer may be formed using one or more deposition methods, such as CVD (Chemical Vapor Deposition), PECVD (Plasma Enhanced Chemical Vapor Deposition), etc. The titanium layer, if formed by CVD or PECVD, may be deposited at a temperature in the range of approximately 400 degrees C. to approximately 800 degrees C. The titanium layer and/or the titanium nitride layer 124, which may be patterned to provide a resistor in the peripheral circuit region, may be controllable in size and/or thickness depending on a desired resistance.

The bit line conductive layer 126 may be formed to have a thickness in the range of approximately 1000 Angstroms to approximately 2000 Angstroms from a conductive material such as tungsten (W). In addition, the bit line conductive layer 126 may be formed using a general deposition method, such as CVD.

Figure 4:
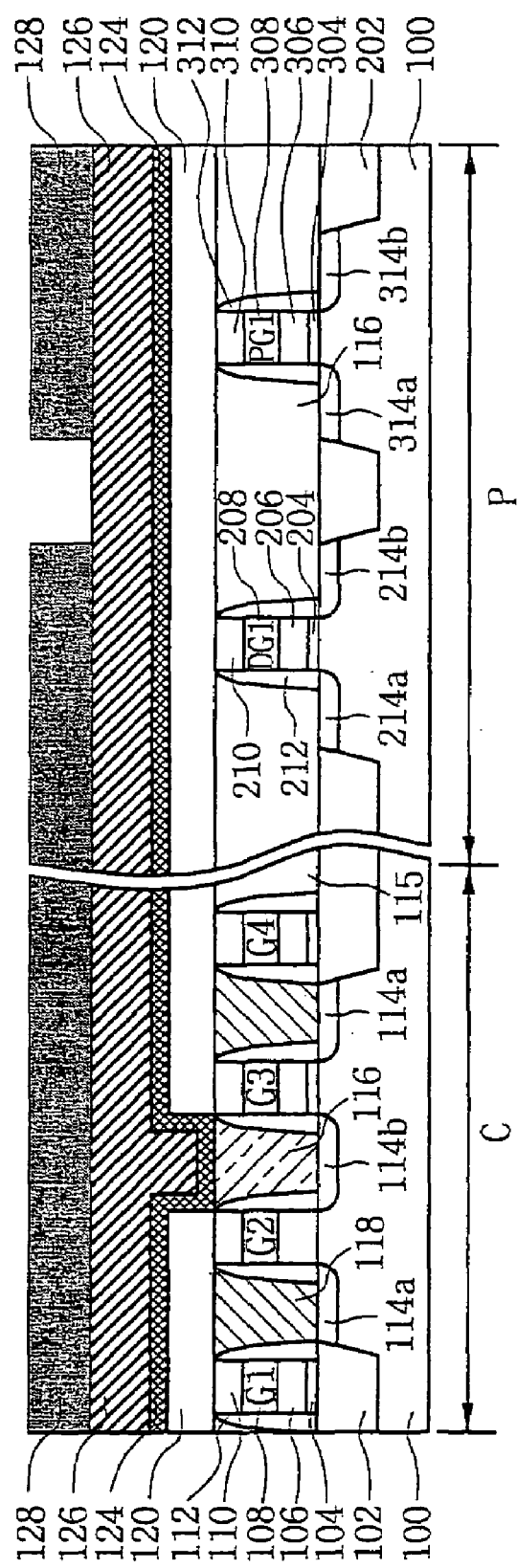

Referring to FIG. 4, a photolithography process may be carried out on the bit line conductive layer 126 to provide a photoresist pattern 128 exposing a portion of the bit line conductive layer 126 to form a resistor thereon. Forming the photoresist pattern 128 may include coating a photoresist layer on the top surface of the bit line conductive layer 126 using a spin coating method, and then performing a photolithography process using a block layer as an exposure mask thereby exposing portions of the conductive layer where the resistor is to be formed and masking the other portions of the conductive layer. The photoresist pattern 128 may be formed to expose a portion of the bit line conductive layer larger than a desired resistor size.

Figure 5:
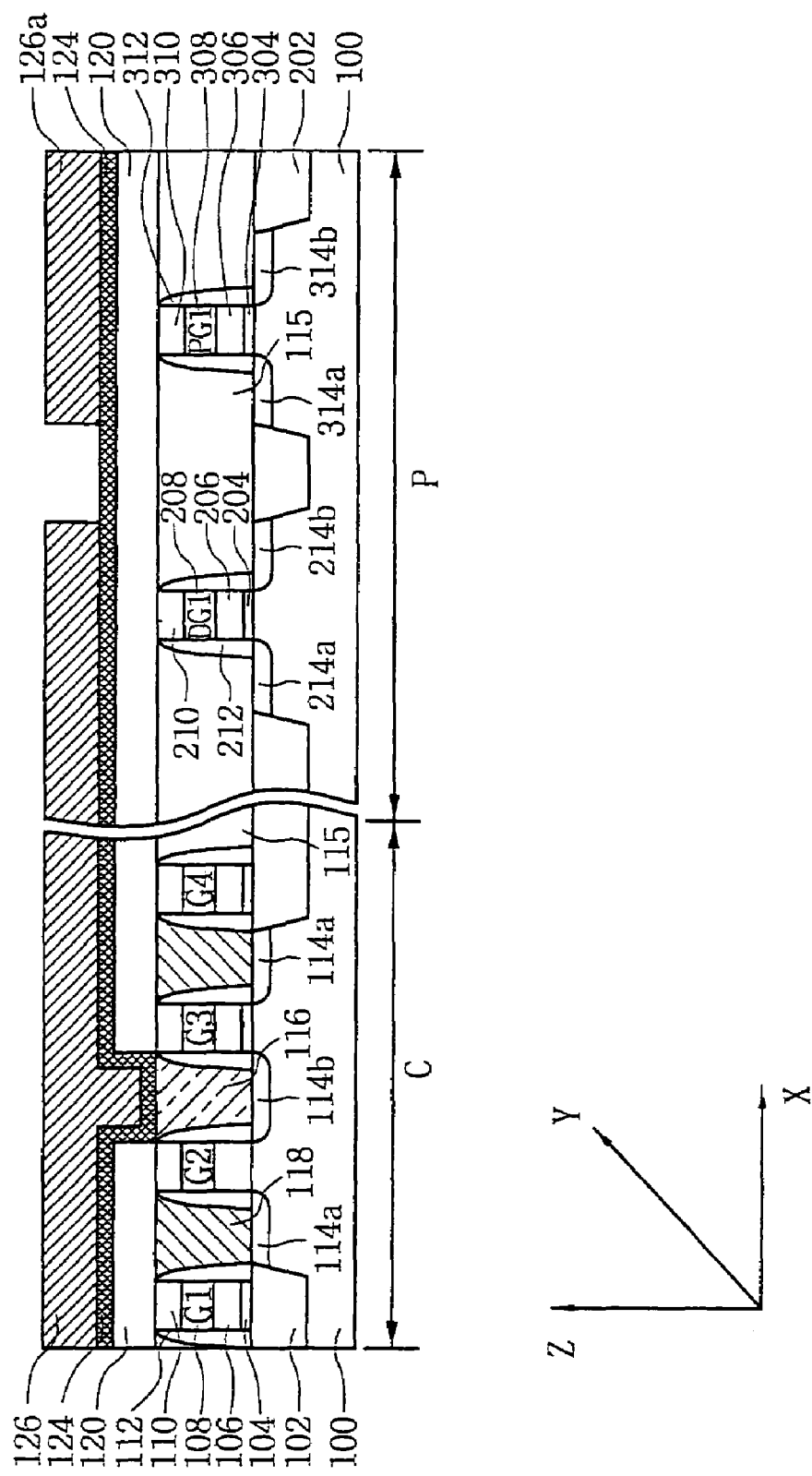

Referring to FIG. 5, the photoresist pattern 128 may be used as an etching mask to selectively etch the bit line conductive layer 126, for example using a dry etching process. The photoresist pattern 128 may then be removed by an ashing or strip process.

Referring to FIG. 6, a capping layer 130 may be formed on the top surface of bit line conductive layer 126a and exposed portions of barrier layer 124. The capping layer 130 may be formed from silicon nitride having an etching selection ratio with respect to an interlayer insulation layer formed from an oxide-based insulation material using, for example, CVD, LPCVD (Low Pressure Chemical Vapor Deposition), PECVD, SACVD (Semi-Atmospheric Chemical Vapor Deposition), sputtering, and/or atomic layer deposition. When using a nitride capping layer, capping layer 130 may be formed from a silicon nitride layer having a refractive index of approximately 2, and more particularly, a silicon-enriched nitride layer having a refractive index in the range of approximately 2.2 to approximately 2.5. A silicon-enriched nitride layer may have a relatively low stress of approximately ⅓ to ½ that of a silicon nitride layer, and may thus reduce cracks caused by stress. A silicon nitride layer may also exhibit a relatively high etching resistance with respect to an etchant for the oxide-based insulation layer. A thickness of the capping layer 130 may be in the range of approximately 500 Angstroms to approximately 2,000 Angstroms in consideration of its function as an etching mask in a subsequent step.

Referring to FIG. 7, a photoresist pattern 132 may be formed on the top surface of the capping layer 130. The photoresist pattern 132 masks portions of the capping layer 130 to define a bit line(s) and a resistor(s) and expose to other portions.

FIG. 8 is taken along the word line direction (i.e., in the Y-axis direction perpendicular to the cross-sections of FIGS. 1-7), with word lines being connected to the gates of the MOS transistors in FIG. 7. The photoresist pattern 132 defining bit lines and resistors may be formed on a top surface of the capping layer 130 in the cell array region C and the peripheral circuit region P.

Referring to FIG. 9, the photoresist pattern 132 may be used as an etching mask to etch the capping layer, the bit line conductive layer, and the barrier layer in sequence. A plurality of bit lines may be formed in the cell array region C, and a resistor 124a having a desired length, a desired width, and a desired thickness may be formed in the peripheral circuit region P.

FIG. 10 is taken along the word line direction (i.e., in the Y-axis direction perpendicular to the cross-sections of FIGS. 1-7 and 9) with word lines being connected to the gates of the MOS transistors in FIG. 9. A plurality of bit line patterns may remain after patterning the barrier layer 124, the bit line conductive layer 126, and the capping layer 130, and the bit line patterns may define stripes in the cell array region C. The resistor 124a having a desired length, a desired width, and a desired thickness may be formed in the peripheral circuit region P.

The structures of FIGS. 1-10 may thus be used to provide a semiconductor memory device such as a dynamic random access memory device. More particularly, the transistors including gate structures G2 and G3 may be memory cell access transistors coupled to a same bit line through shared source/drain region 114b and bit line pad 116. Gate electrodes of the gate structures G2 and G3 may be coupled to different word lines, and the word lines may run in a direction perpendicular with respect to bit lines of the device. Moreover, respective memory cell capacitors may be coupled to the storage node electrode pads 114a.

Figure 11:
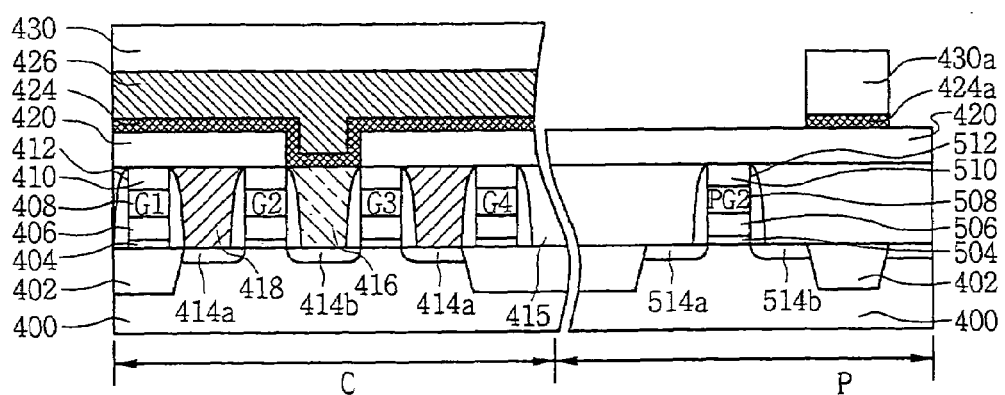
FIG. 11 is a cross-sectional view of a resistor used for a semiconductor device according to embodiments of the present invention.

FIG. 11 is a cross-sectional view of a resistor used for a semiconductor device according to second embodiments of the present invention. Referring to FIG. 11, MOS transistors including gate structures G1, G2, G3 and/or G4 and source/drain regions 414a and 414b may be formed in the cell array region of a semiconductor substrate. In addition, a first interlayer insulation layer 415 may be formed on an entire face of the semiconductor substrate including the gate structures and source/drain regions. Subsequently, storage node electrode pads 418 and bit line pads 416 may be formed between gate structures. A peripheral transistor including a peripheral gate structure PG2 and source/drain regions 514a and 514b may be formed in the peripheral circuit region P of the semiconductor substrate.

A second interlayer insulation layer 420 may be formed on an entire face of the resulting structure including storage node electrode and bit line pads and then patterned to form a bit line contact hole exposing the bit line pad 416. A barrier layer 424 and a bit line conductive layer 426 may be formed in the bit line contact hole and on the second insulation layer 420, and the bit line conductive layer 426 may be patterned to expose a portion of the barrier layer 424 to form a resistor on the peripheral circuit region P. Then, a capping layer 430 is formed on an entire face of the semiconductor substrate including the bit line conductive layer and the exposed portion of barrier layer 424, and the capping layer 430, the bit line conductive layer 426, and the barrier layer 424 may be patterned to form a resistor 424a. A bit line pattern positioned at the same level as the resistor 424a may also be formed in the cell array region C. The bit line pattern may include patterned portions of the barrier layer, the bit line conductive layer, and the capping layer in the cell array region C.

Figure 12:
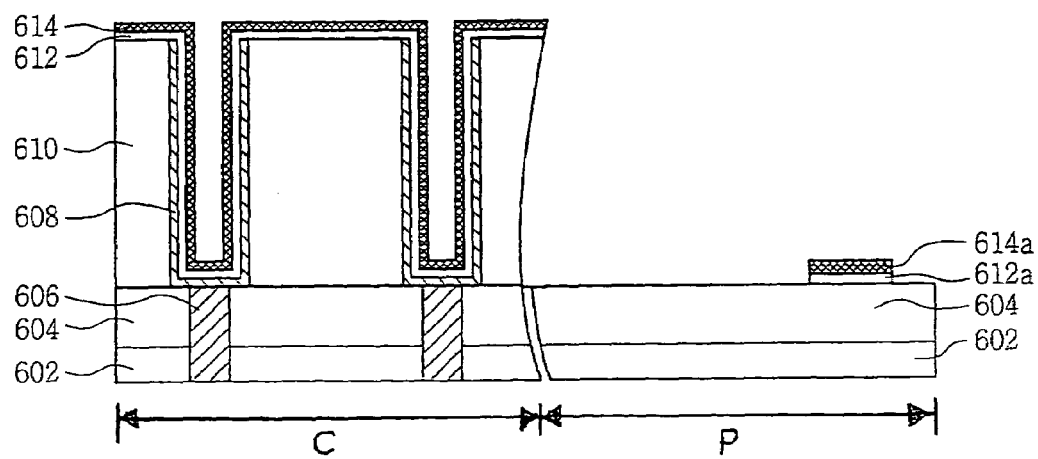
FIG. 12 is a cross-sectional view of a resistor used for a semiconductor device according to embodiments of the present invention.

FIG. 12 is a cross-sectional view of a resistor used for a semiconductor device according to third embodiments of the present invention. Referring to FIG. 12, a dielectric layer 612 may be formed on lower electrodes 608, which are separated from each other and surrounded by an insulation layer 610 on a semiconductor substrate including a cell array region C and a peripheral circuit region P. The dielectric layer 612 may be formed to have a thickness in the range of approximately 100 Angstroms to approximately 200 Angstroms from at least one layer including a material, for example, selected from the group consisting of tantalum oxide ($Ta_2O_5$), aluminum oxide ($Al_2O_3$), titanium oxide ($TiO_2$), silicon nitride ($SiO_2$), silicon nitride ($Si_3N_4$), and/or hafnium oxide ($HfO_2$). The lower electrodes 608 may be formed from at least one layer including a material selected from the group consisting of titanium (Ti), titanium nitride (TiN), tantalum (Ta), tantalum nitride (TaN), titanium tungsten (TiW), tungsten (W), ruthenium (Ru), platinum (Pt), and/or iridium (Ir).

An upper electrode 614 may then be formed on a top surface of the dielectric layer 612 and patterned to form a resistor 614a in the peripheral circuit region P. The upper electrode 614 may be formed of a metallic material such as titanium nitride (TiN) and/or tantalum nitride (TaN) providing a resistance in a predetermined range.

The structure of FIG. 12 may thus be used to provide a semiconductor memory device such as a dynamic random access memory device. For example, conductive plugs 606 may provide electrical coupling between electrodes 608 of memory cell capacitors and respective memory cell access transistors of the cell array region C. More particularly, the insulating layers 604 and 602 may be formed on a semiconductor substrate including memory cell access transistors in a cell array region C thereof.

According to embodiments of the present invention, bit lines may be formed in cell array region C, while a resistor providing a resistance in a predetermined range is formed from a bit line metal layer in the peripheral circuit region P. A resistor having a stable resistance may thus be formed without requiring a separate deposition process. Moreover, the resistor may be controllable in length, width and/or thickness to provide a desired resistance without being significantly affected by variations in process conditions.

As described above, methods according to embodiments of the present invention may form a resistor using a bit line metal layer in a peripheral circuit region P of the semiconductor substrate. A resistor having a resistance in a predetermined range may thus be formed without being significantly affected by variations in process conditions, and a relatively stable resistance of the resistor used for the semiconductor device can be provided. In addition, a resistor that is controllable in length, width, and/or thickness may be formed according to embodiments of the present invention to provide a desired resistance. Furthermore, a resistor using a bit line metal layer in the peripheral circuit region may be formed according to embodiments of the present invention thereby simplifying fabrication of semiconductor devices while reducing defects.

While the present invention has been particularly shown and described with reference to embodiments thereof, it will be understood by those skilled in the art that various changes in form and details may be made therein without departing from the spirit and scope of the invention as defined by the appended claims and their equivalents. Particularly, a resistor controllable in length, width, and/or thickness can be formed in a peripheral circuit region P during fabrication of a semiconductor device using a metal having a resistance in a predetermined range.

What is claimed is:
1. A method of forming an integrated circuit device, the method comprising:
   forming an insulating layer on an integrated circuit substrate;
   forming a first conductive layer on the insulating layer wherein the first conductive layer comprises a first material;
   forming a second conductive layer on the first conductive layer so that the first conductive layer is between the second conductive layer and the insulating layer wherein the second conductive layer comprises a second material different than the first material;
   forming a hole in the second conductive layer so that portions of the first conductive layer are exposed through the hole; and
   after forming the hole in the second conductive layer patterning the first and second conductive layers so that portions of the first and second conductive layers surrounding portions of the first conductive layer exposed though the hole are removed while maintaining portions of the first conductive layer previously exposed through the hole;
   wherein patterning the first and second conductive layers further comprises maintaining portions of the first and second conductive layers to define a conductive line spaced apart from the portion of the first conductive layer previously exposed through the hole;

wherein patterning the first and second conductive layers includes forming a single photoresist pattern on portions of the first conductive layer previously exposed through the hole and on portions of the first and second conductive layers defining the conductive line, and removing portions of the first and second conductive layers exposed by the single photoresist pattern before forming the single photoresist pattern, forming a capping layer on the second conductive layer and on portions of the first conductive layer exposed through the hole, wherein patterning the first and second conductive layers comprises patterning the capping layer.

2. A method according to claim 1 wherein the conductive line includes portions of the first and second conductive layers.

3. A method according to claim 1 wherein the capping layer comprises an insulating material and wherein the capping layer and the insulating layer comprise different materials.

4. A method according to claim 1 wherein after patterning the first and second conductive layers, portions of the first conductive layer previously exposed through the hole in the second conductive layer are maintained as a resistor.

5. A method of forming an integrated circuit device, the method comprising:

forming an insulating layer on an integrated circuit substrate;

forming a first conductive layer on the insulating layer wherein the first conductive layer comprises a first material;

forming a second conductive layer on the first conductive layer so that the first conductive layer is between the second conductive layer and the insulating layer wherein the second conductive layer comprises a second material different than the first material;

forming a hole in the second conductive layer so that portions of the first conductive layer are exposed through the hole;

after forming the hole in the second conductive layer, patterning the first and second conductive layers so that portions of the first and second conductive layers surrounding portions of the first conductive layer exposed through the hole are removed while maintaining portions of the first conductive layer previously exposed through the hole; and after forming the hole and before patterning the first and second conductive layers, forming a capping layer on the second conductive layer and on the portions of the first conductive layer exposed through the hole;

wherein patterning the first and second conductive layers comprises patterning the first and second conductive layers and the capping layer so that the capping layer is maintained on portions of the first conductive layer previously exposed through the hole.

6. A method of forming an integrated circuit device, the method comprising:

forming an insulating layer on an integrated circuit substrate;

forming a first conductive layer on the insulating layer wherein the first conductive layer comprises a first material;

forming a second conductive layer on the first conductive layer so that the first conductive layer is between the second conductive layer and the insulating layer wherein the second conductive layer comprises a second material different than the first material;

forming a hole in the second conductive layer so that portions of the first conductive layer are exposed through the hole; and after forming the hole in the second conductive layer, patterning the first and second conductive layers so that portions of the first and second conductive layers surrounding portions of the first conductive layer exposed through the hole are removed while maintaining portions of the first conductive layer previously exposed through the hole;

wherein the first conductive layer includes at least two sub-layers, a first sub-layer of the first conductive layer including at least one of titanium (Ti) and/or tantalum (Ta), and a second sub-layer of the first conductive layer including at least one of titanium nitride (TiN), tantalum nitride (TaN), and/or tantalum silicon nitride (TaSiN).

7. A method of forming an integrated circuit device, the method comprising:

forming an insulating layer on an integrated circuit substrate;

forming a first conductive layer on the insulating layer wherein the first conductive layer comprises a first material;

forming a second conductive layer on the first conductive layer so that the first conductive layer is between the second conductive layer and the insulating layer wherein the second conductive layer comprises a second material different than the first material;

forming a hole in the second conductive layer so that portions of the first conductive layer are exposed through the hole;

after forming the hole in the second conductive layer patterning the first and second conductive layers so that portions of the first and second conductive layers surrounding portions of the first conductive layer exposed through the hole are removed while maintaining portions of the first conductive layer previously exposed through the hole; and before forming the insulating layer, forming a plurality of cell array transistors on a cell array region of the integrated circuit substrate wherein each of the cell array transistors includes a gate electrode and source/drain regions on opposite sides of the gate electrode, wherein forming the hole in the second conductive layer comprises forming the hole on a peripheral circuit region of the integrated circuit substrate outside the cell array region;

wherein patterning the first and second conductive layers further comprises maintaining portions of the first and second conductive layers to define a conductive line on the cell array region of the integrated circuit substrate wherein the conductive line is electrically coupled with a source/drain region of a cell array transistor through a hole in the insulating layer.

8. A method according to claim 7 wherein the first conductive layer includes at least one of titanium nitride (TiN), tantalum nitride (TaN), titanium silicon nitride (TiSiN), and/or tantalum silicon nitride (TaSiN).

9. A method according to claim 7 wherein the second conductive layer includes tungsten (W).

10. A method according to claim 7 wherein a gate electrode of the cell array transistor is coupled to a word line and wherein the word line is perpendicular to the conductive line on the cell array region electrically coupled with the source/drain region of the cell array transistor.

11. A method of forming an integrated circuit device, the method comprising:

forming a transistor on a cell array region of an integrated circuit substrate, the transistor including a gate electrode and first and second source/drain regions on opposite sides of the gate electrode;

forming a conductive bit line pad on the first source/drain region;

forming an insulating layer on the transistor and on the integrated circuit substrate wherein the insulating layer has a hole therein exposing a portion of the conductive bit line pad;

forming a conductive barrier layer on the insulating layer and on the portion of the conductive bit line pad exposed through the hole in the insulating layer so that the conductive barrier layer is electrically coupled with the first source/drain region through the hole and the conductive bit line pad;

forming a conductive bit line layer on the conductive barrier layer so that the conductive barrier layer is between the conductive bit line layer and the insulating layer wherein the conductive barrier layer and the conductive bit line layer comprise different materials;

forming a hole in the conductive bit line layer so that portions of the conductive barrier layer are exposed through the hole in the conductive bit line layer in a peripheral circuit region of the integrated circuit substrate outside the cell array region and so that portions of the conductive barrier layer exposed through the hole in the conductive bit line layer are surrounded by remaining portions of the conductive bit line layer;

after forming the hole in the conductive bit line layer, patterning the conductive barrier and bit line layers so that portions of the conductive barrier and bit line layers surrounding portions of the conductive barrier layer exposed through the hole in the conductive bit line layer are removed while maintaining portions of the conductive barrier layer previously exposed through the hole in the conductive bit line layer, and so that a bit line comprising portions of the conductive barrier and bit line layers is maintained in the cell array region electrically coupled with the conductive bit line pad.

12. A method according to claim 11 wherein the conductive barrier layer includes at least one of titanium nitride (TiN), tantalum nitride (TaN), titanium silicon nitride (TiSiN), and/or tantalum silicon nitride (TaSiN).

13. A method according to claim 11 wherein the conductive bit line layer includes tungsten (W).

* * * * *